United States Patent [19]

Nakamura

[11] Patent Number: 5,334,277
[45] Date of Patent: Aug. 2, 1994

[54] METHOD OF VAPOR-GROWING SEMICONDUCTOR CRYSTAL AND APPARATUS FOR VAPOR-GROWING THE SAME

[75] Inventor: Shuji Nakamura, Anan, Japan

[73] Assignee: Nichia Kagaky Kogyo K.K., Tokushima, Japan

[21] Appl. No.: 780,469

[22] Filed: Oct. 22, 1991

[30] Foreign Application Priority Data

Oct. 25, 1990 [JP] Japan .................. 2-288665
Mar. 13, 1991 [JP] Japan .................. 3-074822

[51] Int. Cl.$^5$ ............................................. C30B 25/14
[52] U.S. Cl. .................................. 117/102; 117/952
[58] Field of Search ............... 136/610, 611, 612, 613, 136/614, DIG. 99

[56] References Cited

U.S. PATENT DOCUMENTS

| | | | |
|---|---|---|---|
| 3,617,371 | 11/1971 | Burmeister | 156/611 |
| 3,701,682 | 10/1972 | Gartman et al. | 156/611 |
| 3,922,475 | 11/1975 | Manasevit | 156/DIG. 99 |
| 4,473,938 | 10/1984 | Kobayashi et al. | 156/DIG. 99 |
| 4,489,041 | 12/1984 | Wong | 422/186 |
| 4,518,455 | 5/1985 | Meuthing | 156/611 |
| 4,748,135 | 5/1988 | Frijlink | 158/611 |
| 4,812,231 | 3/1989 | Horooka et al. | 427/255 |
| 4,907,534 | 3/1990 | Huang et al. | 118/725 |

FOREIGN PATENT DOCUMENTS

| | | |
|---|---|---|
| 0167703 | 1/1986 | European Pat. Off. . |
| 0254651 | 1/1988 | European Pat. Off. . |
| 0254654 | 1/1988 | European Pat. Off. . |
| 0328417 | 8/1989 | European Pat. Off. . |
| 0343355 | 11/1989 | European Pat. Off. . |

OTHER PUBLICATIONS

Appl. Phys. Lett. 48(5), 3 Feb. 1986, pp. 353–355.
Journal of Crystal Growth 68 (1984) pp. 163–168.
Journal of Crystal Growth 93 (1988) pp. 216–219.
Appl. Phys. Lett. 48(13), 31 Mar. 1986, pp. 870–872.
Inst. Phys. Conf. Ser. No. 63: Chapter 10, 1981, pp. 479–484.
Journal of Crystal Growth 96 (1989) pp. 13–18.
Patent Abstracts of Japan vol. 7, No. 33 (E–157) Feb. 2, 1983 J-A-57 186322 (Mitsubishi Denki K.K.) Nov. 16, 1982.
Patent Abstracts of Japan vol. 12, No. 96 (C–484) Mar. 29, 1988 JP-A-62 228478 (Canon Inc.) Oct. 7, 1987.
Patent Abstracts of Japan vol. 11, No. 33, (E–476) Jan 30, 1987 JP-A-61 202422 (NEC Corp.) Sep. 8, 1986.

*Primary Examiner*—Robert Kunemund
*Attorney, Agent, or Firm*—Nixon & Vanderhyde

[57] ABSTRACT

A method of growing in vapor phase a semiconductor crystal layer supplies a reaction gas to a portion above the surface of a heated substrate so as to be parallel or obliquely to the substrate, and uses a transparent blow tube widened toward its blow port like a funnel to blow a pressing gas, which is inert with respect to the reaction gas, toward the substrate, thereby bringing the reaction gas into contact with the surface of the substrate.

17 Claims, 7 Drawing Sheets

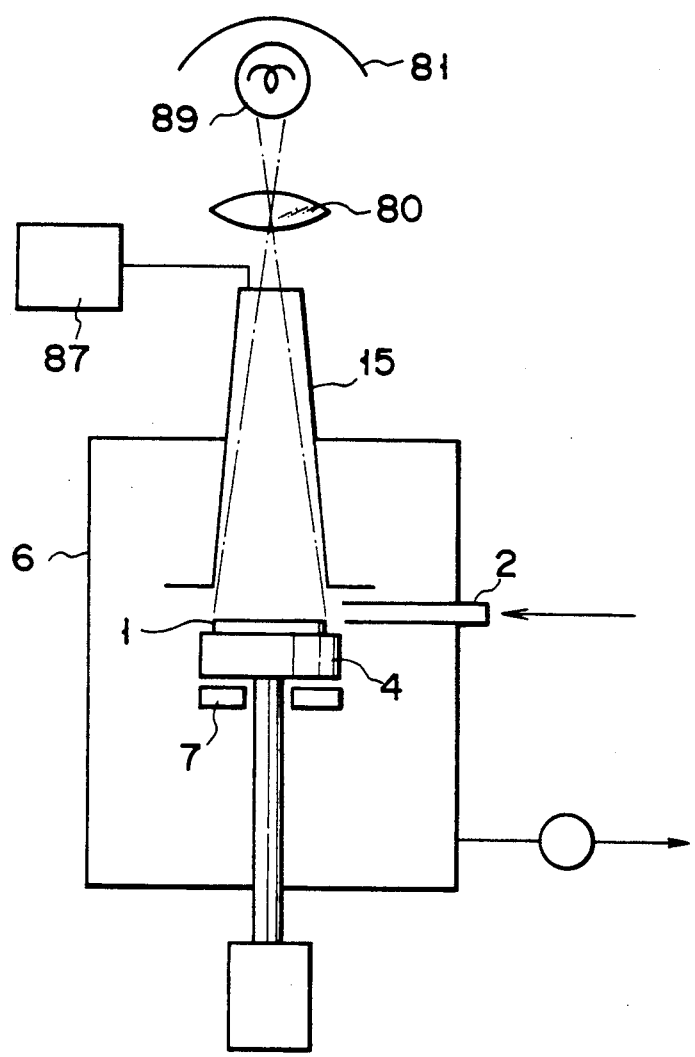
F I G. 8

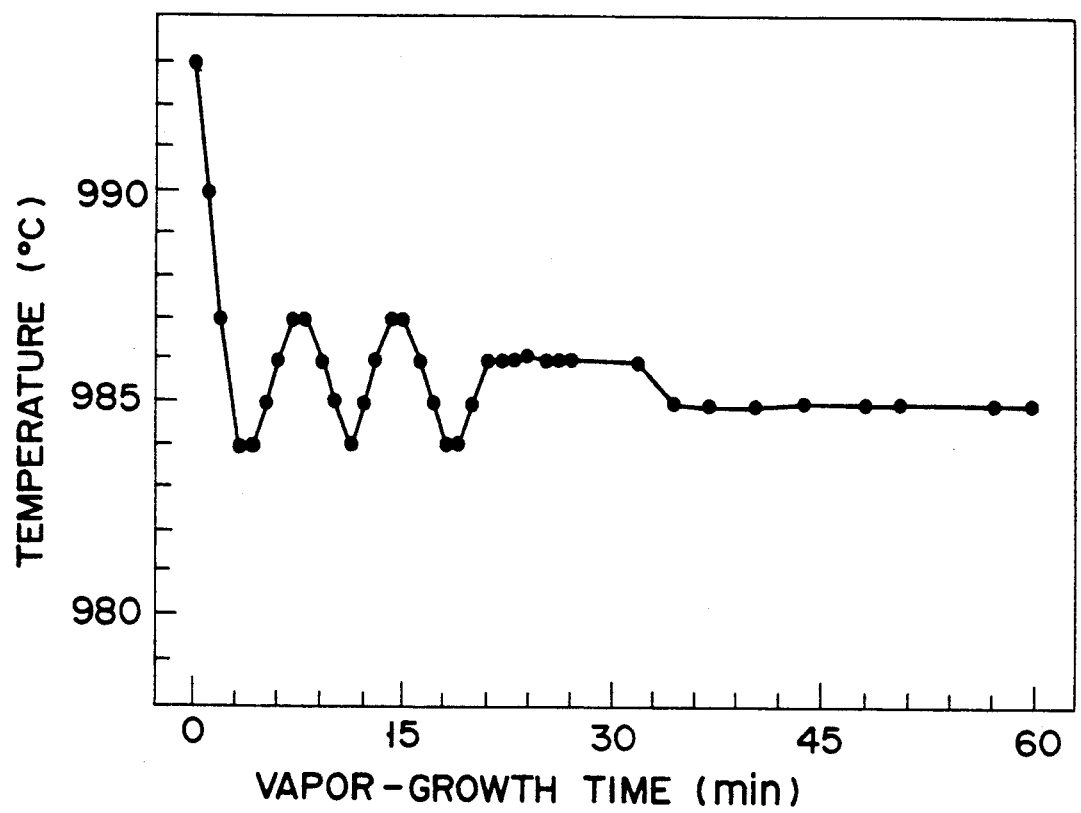
F I G. 10

METHOD OF VAPOR-GROWING SEMICONDUCTOR CRYSTAL AND APPARATUS FOR VAPOR-GROWING THE SAME

BACKGROUND OF THE INVENTION

1. Field of the Invention

The present invention relates to a method of growing in vapor phase a semiconductor crystal film consisting of a nitrogen compound and, more particularly, to a method of vapor-growing a semiconductor crystal film by blowing a reaction gas on the surface of a substrate.

2. Description of the Related Art

Generally, GaN, InN, AlN, and their semiconductor crystals are vapor-grown by apparatuses shown in FIGS. 1 to 4.

For example, a method of growing GaN on the surface of a substrate will be described below with reference to FIG. 1.

i) A sapphire with (0001) orientation (C face) is generally used as a substrate. A sapphire substrate 1 is placed on a carbon susceptor 4 in a chamber 6.

ii) While $H_2$ is flowed, the carbon susceptor 4 is heated up to a high temperature of 950° C. to 1,150° C. by radio frequency induction heating means 7.

iii) Trimethylgallium (TMG) as a Ga source, ammonia ($NH_3$) as an N source, and $H_2$ as a carrier are blown to the surface of the substrate from a reaction gas blow tube.

These reaction gases are blown to a portion above and very close to the substrate 1 from a thin reaction gas blow tube 2 having an inner diameter of about 5 mm to 10 mm. The reaction gases are blown against the substrate as a high-speed flow at a flow rate of 2 m/sec or more.

In this manner, a GaN film having a thickness of about 2 to 5 μm can be grown on the sapphire substrate in a growth time of 30 to 60 minutes.

FIG. 2 shows a conventional semiconductor crystal film growth apparatus. As shown in FIG. 2, this apparatus comprises a chamber, a carbon susceptor 43 which is non-rotating and incorporated in the chamber and on which a substrate can be set obliquely to the horizontal direction, a reaction gas blow tube 45 capable of horizontally blowing a reaction gas to the substrate, and a reduction gas $H_2$ blow tube 44. A RF coil 42 is horizontally arranged and wound around the outer circumferential wall of the chamber around the carbon susceptor 43. A load-lock chamber 41 is connected to the chamber. A rotary pump 46 is connected to the chamber, and a turbo pump 46 47 and a rotary pump 48 are connected to the load-lock chamber 41. In this apparatus, a reaction gas is horizontally blown to a substrate set obliquely to the horizontal direction on the fixed carbon susceptor. Note that the carbon susceptor is not rotated and no pressing gas is used.

FIG. 3 shows an apparatus almost similar to the apparatus shown in FIG. 1. This apparatus comprises a chamber 51, a rotary carbon susceptor 53 incorporated in the chamber 51, a substrate 59 set on the susceptor 53, a reaction gas blow tube 55 extending downward from the upper portion of the chamber 51, and a reduction gas $H_2$ blow tube 54. A vertically RF coil 52 is arranged and wound around the outer circumferential wall of the chamber 51 around the carbon susceptor 53.

FIG. 4 shows an apparatus comprising a chamber 61, a rotary carbon susceptor 63 which is incorporated in the chamber 61 and on which a substrate 69 can be set obliquely to the vertical direction, and a reaction gas blow tube 65 extending downward from the upper portion of the chamber 61. The reaction gas blow tube 65 is branched into lines 70 and 71 at its upper portion. A gas mixture of $NH_3$ and $H_2$ is flowed through the line 70, and a gas mixture of TMG and $H_2$ is flowed through the line 71. A vertically RF coil 62 is arranged and wound around the outer circumferential wall of the chamber 61 around the susceptor 63.

In order to grow a semiconductor crystal film on a substrate by the above method, the flow rate of a reaction gas must be increased. That is, no GaN can be grown unless the flow rate of a reaction gas is 2 m/sec or more. This is assumed to be attributed to the fact that if the flow rate of a reaction gas is not sufficiently high, the reaction gas is prevented from reaching the substrate by a large heat convection current formed by a high reaction temperature.

For this reason, in order to obtain a high-speed flow of a reaction gas, a thin reaction gas blow tube having an inner diameter of 5 to 10 mm is used in conventional growth methods. The lower opening end of this thin reaction gas blow tube is located at a position separated from above the surface of a substrate by 5 to 10 mm.

When GaN is grown on the surface of a sapphire substrate in this state, the diameter of an area of the grown semiconductor crystal film is about 5 to 10 mm, i.e., only a very small film can be obtained. For example, when a sapphire substrate having a diameter of 2 inches is used, the area of a grown semiconductor crystal film is about 2/50 or less the area of the substrate, resulting in very low yield. That is, the conventional growth methods cannot uniformly grow a semiconductor crystal film in a large area having a diameter of 10 mm or more on the surface of a substrate.

In addition, in the conventional methods, a large amount of a GaN reaction product adheres on the distal end of the thin reaction gas blow tube each time a semiconductor crystal film is grown on the surface of a substrate. If the temperature of the substrate is increased during the growth of the semiconductor crystal film, GaN deposited on the reaction gas blow tube is decomposed into Ga metal by the influence of this heat, and the Ga metal falls on the substrate during the reaction. Since no GaN is grown on portions where Ga fell, the growth yield is extremely decreased.

In an extreme case, the thin reaction gas blow tube must be replaced by a new one or washed each time the reaction is caused, resulting in very poor operability.

When a CVD method such as a metal organic chemical vapor deposition method (to be referred to as an MOCVD method hereinafter) or a molecular beam epitaxy method is used to grow semiconductor crystals on a substrate set in a reactor, it is important to prepare a "monitor window" free from contamination in the reactor. During the growth of semiconductor crystals, this "monitor window" is used to externally observe the crystal growth state, or light is radiated on a crystal layer through the "monitor window" to give optical energy to the growing crystal layer, thereby changing the growth state.

Conventionally, several structures have been proposed and used as the "monitor window" of a reactor. FIG. 5 shows a conventional apparatus using an example of the "monitor window". This reactor vessel 10 has a double cylinder structure using quartz tubes. An induction coil 12 for heating a substrate 18 is wound outside an outer tube. A "monitor window" 13 is open in an inner tube at a position above the substrate 18. A reaction gas is supplied into the inner tube to grow a semiconductor crystal layer on the surface of a substrate. Hydrogen, for example, is flowed into the outer tube to prevent the reaction gas from flowing into the outer tube.

In the apparatus having the above structure, however, since the inner surfaces of the inner and outer tubes are contaminated by the reaction gas, these tubes cannot be successively used a plurality of times. That is, since the reaction gas constantly flows through the inner tube, a decomposition product of the reaction gas immediately adheres to blacken the inner surface of the inner tube. In the outer tube, similarly, hydrogen gas flowing through the outer tube forms a turbulent flow near the "monitor window" to allow the reaction gas to flow into the outer tube. The reaction gas is brought into contact with the inner surface of the outer tube at a portion located above the "monitor window" and gradually contaminates this portion to make it difficult to observe a substrate.

Therefore, the entire reactor must be replaced after it is used only several times. In the replacement of the reactor, since moisture in air is adsorbed in the interior of the reactor, complicated steps of, e.g., vacuum baking or gas baking must be repeatedly performed a number of times over several days in order to remove the moisture, resulting in a very cumbersome operation.

As a method of growing a semiconductor crystal layer, a method of growing crystals while radiating light is available. In this method, a growth temperature can be significantly decreased by radiating light, and a light source 14 is arranged outside a reactor in order to radiate light. The light source radiates an epitaxial crystal layer with light which is transmitted through a "monitor window". In this method, it is very important to keep the "monitor window" clean because a contaminated "monitor window" absorbs light to reduce light radiation intensity on the epitaxial crystal layer.

SUMMARY OF THE INVENTION

The present invention has been made to solve the above conventional problems.

It is a first object of the present invention to provide a method of vapor-growing a semiconductor crystal film, which can grow a semiconductor crystal film having a large area on the surface of a substrate with high yield.

It is a second object of the present invention to provide an apparatus for growing a semiconductor crystal film, which can be prevent a "monitor window" from being contaminated over a long time period to enable observation of the state of crystal growth.

It is a third object of the present invention to provide a method of vapor-growing a semiconductor crystal layer by using a semiconductor crystal layer growth apparatus having a "monitor window" free from contamination and radiating light through the "monitor window" at a high efficiency.

According to the present invention, there is provided a method of vapor-growing in vapor phase a semiconductor crystal layer, comprising the steps of supplying a reaction gas to a portion above a surface of a heated substrate so as to be parallel or obliquely to the substrate, and blowing a pressing gas, which is inert with respect to the reaction gas, toward the substrate to bring the reaction gas into contact with the surface of the substrate. The pressing gas is preferably blown using a blow tube which is widened like a funnel toward a blow port. More preferably, this blow tube is transparent.

In addition, according to the present invention, there is provided an apparatus for growing a semiconductor crystal film, comprising a reactor, a susceptor, provided in the reactor, for supporting a substrate, means for heating the susceptor, reaction gas supply means for supplying a reaction gas parallel or obliquely to the substrate, and a blow tube, having a shape widened toward a blow port thereof like a funnel, for blowing a pressing gas, which is inert with respect to the reaction gas, toward the substrate to bring the reaction gas into contact with a surface of the substrate. Preferably, this blow tube is transparent.

When the method and the apparatus of the present invention are used, the reaction gas blow tube need not be arranged above a substrate. Therefore, even when GaN deposited on the reaction gas blow tube is decomposed into Ga metal, the Ga metal does not fall to adhere on the substrate. In addition, since the direction of the reaction gas is changed by the pressing gas, the Ga metal hardly reaches a substrate even when the reaction gas is blown parallel to the substrate. Therefore, the yield of a sapphire substrate is not decreased, and the reaction gas blow tube need not be frequently washed or replaced.

The most important effect of this pressing gas is to urge and bring the reaction gas flowing parallel or obliquely to a substrate in contact with the surface of the substrate. If no pressing gas is used, almost no film growth is obtained on the substrate. The reason for this is that heat convection is caused on the substrate due to a high substrate temperature of about 1,000° C. If no pressing gas is used, the reaction gas is raised by the heat convection and cannot be brought into contact with the substrate. Therefore, the pressing gas is flowed to urge the rising reaction gas downward to be brought into contact with the substrate. As described above, in the method of the present invention, a GaN epitaxial film can be grown by using the pressing gas.

In addition, the method of the present invention enables growth of GaN even when a reaction gas is horizontally blown. Furthermore, since a substrate is rotated, a GaN epitaxial film can be uniformly grown on a large area.

In conventional methods, the diameter of an effective area of a semiconductor crystal film grown on the surface of a substrate by one growth operation cycle is at most 10 mm. Therefore, when a sapphire substrate having a diameter of 2 inches is used, this operation must be repeated a number of times to make it difficult to form an uniform semiconductor crystal film on the entire substrate. On the contrary, when a semiconductor crystal film is grown on the surface of a sapphire substrate in accordance with the present invention, uniform GaN can be grown on the entire sapphire substrate even when the outer diameter of the substrate is 2 inches.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 7 to 9 are schematic sectional views each showing a semiconductor crystal film growth apparatus used in the method of the present invention; and FIG. 10 is a graph showing the temperature as a function of the growth time.

DETAILED DESCRIPTION OF THE PREFERRED EMBODIMENTS

In a method of growing a semiconductor crystal film according to the present invention, in order to solve conventional problems, a reaction gas is blown parallel or obliquely to a substrate, and a pressing gas is flowed toward the substrate, thereby forming a semiconductor crystal film.

This method can be applied to materials which can be grown by chemical vapor deposition methods such as an MOCVD method, a plasma CVD method, and a microwave CVD method.

Figure 6:
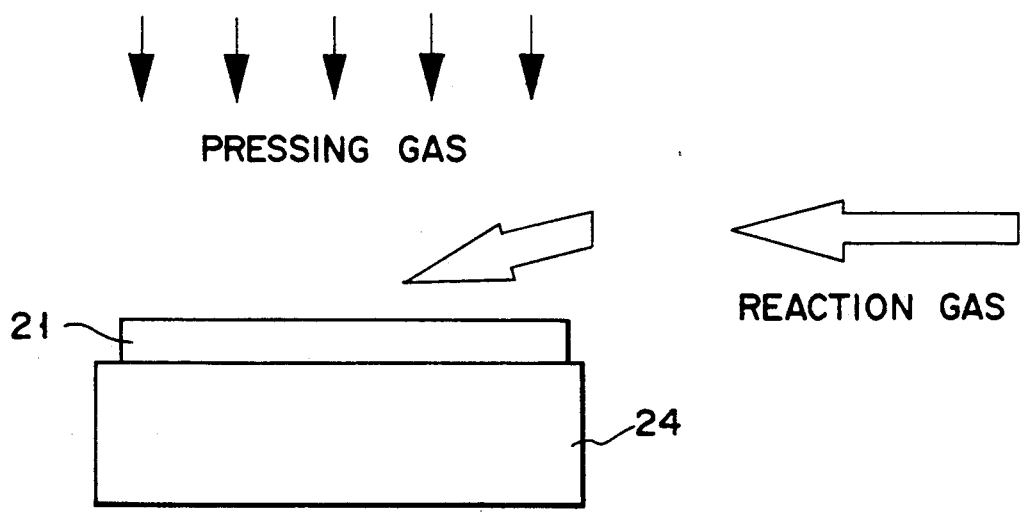
FIG. 6 is a side view showing a method of the present invention, in which flow directions of gases are illustrated.

FIG. 6 is a view schematically showing a method of growing a semiconductor crystal film according to the present invention. As shown In FIG. 6, a reaction gas is blown parallel or obliquely to a substrate 21 placed on a susceptor 24, and a pressing gas is blown toward the substrate 21, thereby changing the direction of a flow of the reaction gas to be blown against the substrate 21.

Preferably, the reaction gas is blown parallel to the substrate at a high speed, and the pressing gas is flowed vertically toward the substrate, thereby changing the direction of the reaction gas above the substrate so as to be blown against the substrate.

Examples of the reaction gas are metal organic gases such as trimethylgallium (TMG), trimethylaluminum (TMA), diethylzinc (DEZ), and trimethylindium (TMI), arsine ($AsH_3$), phosphine ($PH_3$), ammonia ($NH_3$), silane ($SiH_4$), $H_2Se$, $H_2S$, and methane ($CH_4$).

Since the pressing gas to be flowed vertically downward to a substrate is used to change the direction of the reaction gas toward the substrate, all inert gases having no influence on the reaction gas can be used as the pressing gas. Examples of the pressing gas are $H_2$ gas, $N_2$ gas, $NH_3$ gas, He gas, Ne gas, and Ar gas, and these gases can be used singly or as a mixture thereof.

In order to flow the pressing gas toward a substrate, a blow tube molded into a funnel-like shape widened toward a gas blow port is preferably used. When the pressing gas is blown by a sub blow tube having this shape, a flow of the pressing gas forms a laminar flow which can uniformly flow toward a substrate. The size of the blow port is substantially the same as the substrate. When this blow tube is used, even if a sapphire substrate having an outer diameter of 2 inches is used, GaN can be grown on the entire substrate by performing a vapor-growth operation once.

When a substrate having a diameter of, e.g., 2 inches is used, a preferable flow rate of the pressing gas is 0.02 to 0.5 m/sec on the substrate.

According to the present invention, since a crystal film can be uniformly grown on the entire surface of a sapphire substrate (C face) having a diameter of 2 inches, i.e., a large semiconductor crystal film can be grown by performing a vapor-growth operation once, great industrial merits can be obtained.

In addition, the carrier concentration of a semiconductor crystal film manufactured by the method of the present invention is 1/10 or less those of conventional products, and its Hall mobility is five or more times those thereof. Therefore, high-quality GaN can be grown.

According to the present invention, the blow tube for blowing the pressing gas to a substrate was not contaminated regardless of the number of times of reaction. Therefore, the temperature of the substrate could be monitored by an infrared radiation thermometer provided outside the blow tube.

In addition, since the reaction gas blow tube for flowing the reaction gas can be arranged beside the susceptor, the temperature of the tube hardly rises, and almost no GaN adheres on the tube. Therefore, Ga melt does not fall on the substrate during the reaction to reduce the yield.

The apparatus of the present invention comprises a reactor, a susceptor provided in the reactor, for supporting a substrate, means for heating the susceptor, reaction gas supply means for supplying a reaction gas parallel or obliquely to the substrate, and a blow tube, having a shape widened toward a blow port thereof like a funnel, for blowing a pressing gas, which is inert with respect to the reaction gas, toward the substrate to bring the reaction gas into contact with a surface of the substrate.

The funnel-like portion of the blow tube is widened by an angle of preferably 20° or less, and more preferably, 10° or less with respect to the axis of the blow tube. The blow tube is preferably transparent. This apparatus may further comprise means for performing light radiation.

When a transparent tube is used in the apparatus of the present invention, since the transparent tube is not contaminated by the reaction gas over a very long time period but functions as a "monitor window", a growth state of a semiconductor crystal layer can be accurately observed. In the apparatus of the present invention using a transparent tube, almost no contamination was found in the transparent tube even after the apparatus was used over several hundreds hours.

In the method of the present invention, when a transparent tube serving as a "monitor window" which is free from contamination even after a very long-time use is used, light can be radiated on a semiconductor crystal layer through the transparent tube. Therefore, since light emitted from a light source is not attenuated but efficiently radiated on the epitaxial crystal layer, its optical energy can be effectively used to vapor-grow the semiconductor crystal layer.

In addition, when a transparent tube is used in the apparatus of the present invention, the temperature of a substrate on which a crystal layer is grown can be measured through the transparent tube by detecting an infrared intensity radiated from the crystal layer, thereby measuring the film thickness of the crystal layer.

Furthermore, in the apparatus of the present invention, since the transparent tube is not contaminated and therefore need not be replaced, the number of cleaning means using vacuum baking or gas baking can be minimized. Therefore, semiconductor crystal layers can be efficiently produced.

Figure 7:
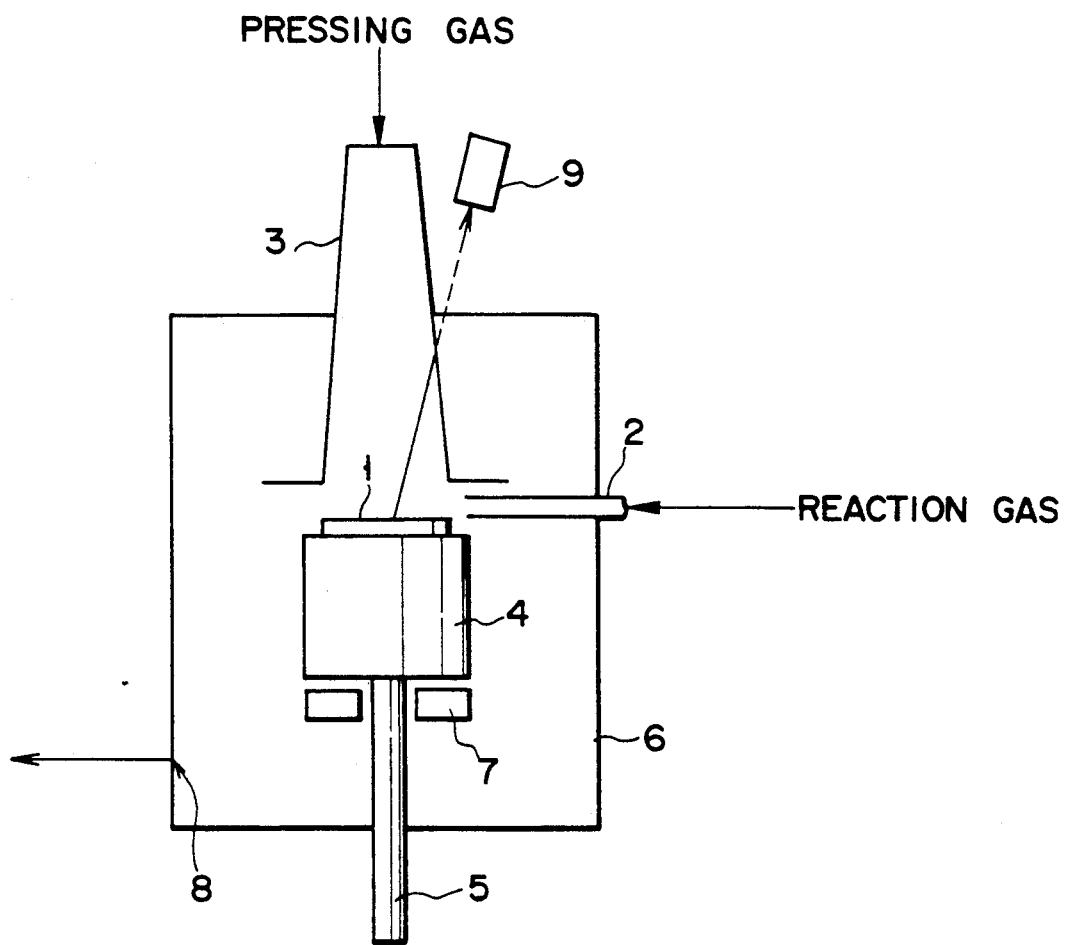

Vapor-growth of a semiconductor crystal film will be described in detail below with reference to FIG. 7 showing an apparatus for realizing the vapor-growth method of the present invention.

Before explanation of examples, this apparatus will be briefly described.

The semiconductor crystal film vapor-growth apparatus shown in FIG. 7 is an apparatus for growing an epitaxial film consisting of GaN, AlN, InN, or mixed crystals thereof using an MOCVD method. The apparatus comprises a chamber 6, a susceptor 4, a heater 7, a reaction gas blow tube 2 an infrared-intensity detector 9, and a sub blow tube 3.

The chamber 6 is made of stainless steel and has a closed shape capable of shielding the outer atmosphere. Although not shown, a load/unload port is formed in the chamber 6 to load/unload a sapphire substrate 1. The load/unload port is covered with a cover capable of airtightly closing it. An exhaust port 8 for exhausting gases in the chamber is formed in the chamber. The exhaust port 8 is connected to an exhaust pump (not shown) so that gases are forcibly exhausted by the exhaust pump.

The susceptor 4 arranged in the chamber 6 has a horizontal upper surface and can rotate in a horizontal plane. The susceptor 4 is a circular column having a diameter of 30 to 100 mm and a height of 10 to 30 mm, and a shaft 5 is vertically fixed to the center of the lower surface of the susceptor 4.

The susceptor 4 is heated up to 1,000° C. or more by the heater 7 arranged below its lower surface. The susceptor 4 consists of a substance having a heat resistance and not contaminating gases in the chamber 6 upon heating, e.g., a material obtained by coating the surface of carbon with silicon carbide.

The heater 7 is arranged close to but not in contact with the lower surface of the susceptor 4 and sets the susceptor 4 at a predetermined temperature in accordance with a temperature sensor (not shown) incorporated in the susceptor and ON/OFF control or supply current control.

The heater 7 can be arranged in any position where it can heat the susceptor 4. Although not shown, the heater may be incorporated in the susceptor to form an integral structure.

The reaction gas blow tube 2 is airtightly fixed through the chamber 6 horizontally or slightly obliquely. The distal end of the reaction gas blow tube 2 is extended close to the substrate 1 so as to blow a reaction gas on the surface of the substrate 1 placed on the susceptor 4.

The reaction gas blow tube 2 blows hydrogen gas, ammonia gas, and trimethylgallium (TMG) or trimethylaluminum (TMA) gas to the surface of the substrate 1.

The sub blow tube 3 is airtightly fixed through the upper wall of the chamber 6. The sub blow tube 3 vertically blows an inert gas consisting of hydrogen or nitrogen downward to the substrate 1. In order to uniformly blow the inert gas on the upper surface of the substrate 1, the sub blow tube 3 has a funnel-like shape in which an opening area is widened downward. The lower end opening portion of the sub blow tube 3 is designed to have substantially the same size as the substrate 1. The lower end of the sub blow tube 3 is open close to the upper surface of the substrate 1. An interval between the lower end of the sub blow tube 3 and the substrate 1 is adjusted to be preferably 5 mm to 50 cm, and more preferably, 10 mm to 30 cm.

The sub blow tube 3 most preferably has a conical shape. However, the tube need not be a cone but may be an elliptical cone or a pyramid having a sectional area increasing toward the opening end. When a pyramidal transparent tube is used as the sub blow tube 3, each corner of a polygonal section is preferably curved at a predetermined curvature.

A conical quartz tube or a pyramidal quartz tube having corners curved at a predetermined curvature is conventionally used as a reactor of a vertical MOCVD apparatus. Since a gas flowing in a tube having this shape forms a uniform laminar flow, the gas can be uniformly flowed.

The sapphire substrate 1 is placed on the susceptor 4 heated up to 1,000° C. to 1,050° C. and rotated in the horizontal plane. The susceptor 4 is rotated by the shaft 5 vertically fixed to the center of its lower surface. The growth pressure is adjusted to be the atmospheric pressure in the chamber 6. To grow GaN on the sapphire substrate, a reaction gas mixture of TMG, $NH_3$, and $H_2$ is flowed from the reaction gas blow tube 2 to a portion above the substrate 1 in a direction parallel to the substrate 1. Subsequently, a gas mixture of $N_2$ and $H_2$ is flowed as the pressing gas from the sub blow tube 3 arranged above the substrate 1 toward the surface of the substrate 1.

Referring to FIG. 7, the blow tube 3 may consist of a transparent substance which can resist the temperature of the susceptor heated up to 1,000° C. or more, e.g., quartz glass.

An apparatus shown in FIG. 8 has a structure in which a light source 89 is arranged above a transparent tube 15 as shown in FIG. 7. A pressing gas source 87 connects with the transparent tube 15. The light source 89 radiates light on a semiconductor crystal layer to grow the semiconductor crystal layer at a low temperature. The light source 89 is arranged above the transparent tube 15, and light radiated from the light source 89 is focused by a lens 80 or a reflecting mirror 81 and uniformly radiated on the surface of a semiconductor crystal layer laminated on the substrate. When light is focused and radiated in this manner, a semiconductor crystal layer can be irradiated with light having high intensity. An ultraviolet lamp such as a mercury lamp or a xenon lamp is used as the light source. The power of a lamp used as the light source is 200 W to several kW.

Figure 9:
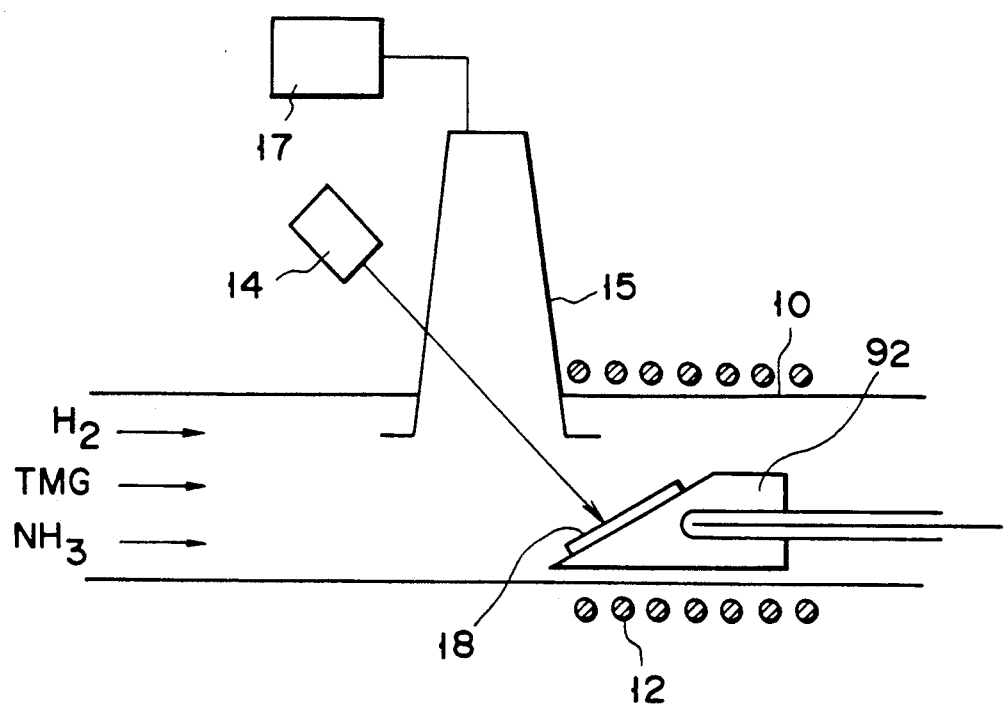

FIG. 9 shows an apparatus for vapor-growing a semiconductor crystal layer on a substrate 18 by supplying a reaction gas from one side of a cylindrical reactor 10. This apparatus is often used to grow crystals of, e.g., GaAs or GaAlAs. The shape of the reactor 10 is a horizontally elongated cylinder. A susceptor 92 is arranged in the reactor 10 and heated by an induction coil 12. A transparent tube 15 is vertically extended above the substrate 18. The transparent tube 15 has the same structure as that of the apparatus shown in FIG. 8. The upper end of the transparent tube 15 is connected to a supply source of a gas such as hydrogen or nitrogen. A gas 17 supplied to the transparent tube 15 uniformly flows as a laminar flow in the transparent tube 15 to prevent a reaction gas from flowing into the transparent tube 15.

Although not shown, in the apparatus shown in FIG. 9, as in the apparatus shown in FIG. 8, a light source may be arranged above the transparent tube 15 to radiate light on a substrate.

The semiconductor crystal film growth apparatus shown in FIG. 7 was used to grow a semiconductor crystal film as a nitrogen compound under the following conditions.

EXAMPLE 1

GaN was grown on a sapphire substrate by the following steps.

①  A washed sapphire substrate 1 (C face) having a diameter of 2 inches was placed on the susceptor 4.

②  Air in the stainless steel chamber 6 was exhausted by the exhaust pump and replaced by $H_2$.

③  Thereafter, the susceptor 4 was heated up to 1,150° C. while $H_2$ gas was supplied from the reaction gas blow tube 2 having an inner diameter of about 10 mm and the sub blow tube 3 having a maximum diameter of about 60 mm.

④  This state was maintained for 10 minutes to remove an oxide film on the surface of the sapphire substrate.

⑤  The reaction temperature of the substrate was decreased to 1,000° C., and the substrate was left to stand until the temperature was stabilized.

⑥  Subsequently, hydrogen and nitrogen gases were supplied from the sub blow tube 3 in the upper portion of the chamber 6, and ammonia gas and hydrogen gas were supplied from the horizontal reaction gas blow tube 2.

The flow rate of both of the hydrogen and nitrogen gases supplied from the sub blow tube 3 into the chamber was adjusted to be 5 l/min. The flow rates of the ammonia gas and the hydrogen gas blown from the reaction gas blow tube 2 were adjusted to be 5 l/min and 1 l/min, respectively. This state was maintained until the temperature was stabilized.

⑦  Thereafter, TMG gas was blown from the reaction gas blow tube 2 in addition to the ammonia gas and the hydrogen gas. The flow rate of the TMG gas was $5.4 \times 10^{-5}$ mol/min. Vapor-growth was started in this state and continued for 60 minutes. In this vapor-growth step, the susceptor 4 was rotated at 5 rpm.

The obtained substrate was removed from the chamber 6, and the film thickness distribution of the substrate was measured by a Nomarski microscope. As a result, the film thickness of a semiconductor crystal film fell within the range of 4 $\mu m \pm 10\%$ on the entire surface, i.e., was very uniform.

The carrier concentration indicating purity of GaN obtained in Example 2 was $1 \times 10^{18}/cm^3$, and its Hall mobility was 250 $cm^2/V \cdot sec$. Generally, it is assumed that when the carrier concentration is low in Hall measurement, the concentration of an impurity serving as carriers is low or the number of lattice defects serving as carriers is small. In addition, it is generally assumed that N (nitrogen) vacancies are sources of n-type carriers in GaN crystals, and that the electron carrier concentration is $2 \times 10^{19}/cm^3$ and the Hall mobility is 50 $cm^2/V \cdot sec$. Therefore, since the value of Hall mobility of GaN obtained by the apparatus of the present invention is five times that of the general mobility, this GaN is excellent in crystallinity. It is assumed that this good crystallinity is obtained by an effect of the pressure gas. That is, the reaction gas is efficiently brought into contact with a substrate by the pressing gas to cause growth of a GaN film. In addition, the pressing gas prevents N from being released from grown GaN by decomposition caused by the heated substrate. In conventional methods, N vacancies are formed upon releasing of N from GaN. In the method of the present invention, however, the crystallinity is improved because the number of N vacancies is remarkably decreased.

The sub blow tube in the upper portion of the apparatus was not contaminated at all. In addition, even after the reaction was caused twice or more by the apparatus, no Ga metal adhered on the surface of a grown semiconductor crystal film.

EXAMPLE 2

AlN was vapor-grown as a buffer layer on the surface of a sapphire substrate and GaN was vapor-grown thereon by the following steps.

①  A sapphire substrate (C face) washed well and having a diameter of 2 inches was placed on the susceptor 4.

②  Air in the chamber 6 was sufficiently evacuated and replaced by $H_2$.

③  $H_2$ gas was supplied into the chamber 6 from the reaction gas blow tube 2 having an inner diameter of about 10 mm and a sub blow tube 3 having a maximum diameter of about 60 mm, and the susceptor 4 was heated up to 1,150° C.

④  Thereafter, this state was maintained for 10 minutes to remove an oxide film on the sapphire surface.

⑤  The temperature of the substrate 1 was slowly decreased to 600° C.

When the temperature of the substrate 1 was set at 600° C., hydrogen gas was blown from the sub blow tube 3 in the upper portion, and ammonia gas, hydrogen gas, and trimethylaluminum (TMA) gas were blown from the reaction gas blow tube 2. 15 The flow rate of the hydrogen gas supplied from the sub blow tube 3 was 15 l/min. The flow rates of the ammonia gas, the hydrogen gas, and the TMA gas blown from the reaction gas blow tube 2 were 5 l/min, 1 l/min, and $1 \times 10^{-5}$ mol/min, respectively.

This state was maintained for 1 minute to vapor-grow an AlN buffer layer on the surface of the sapphire substrate 1.

⑥  Subsequently, supply of the TMA gas was stopped, and the temperature of the substrate 1 was increased to 1,000° C. while the other gases were supplied.

⑦  After the substrate 1 was heated up to 1,000° C., TMG gas was flowed in place of the TMA gas at a flow rate of $5.4 \times 10^{-5}$ mol/min to vapor-grow GaN for 60 minutes.

In this step, the hydrogen and ammonia gases were supplied at the flow rates described above from the sub blow tube 3 and the reaction gas blow tube 2.

In addition, in this growth step, the susceptor 4 was rotated at 5 rpm.

After the growth, the substrate 1 was removed from the chamber 6 and observed by a Nomarski microscope. As a result, the semiconductor crystal film obtained in Example 2 was vapor-grown on the entire surface of the 2-inch diameter sapphire substrate 1. The surface of the film was a mirror surface, and the film thickness was 5 $\mu m \pm 10\%$ on the entire surface of the 2-inch diameter substrate 1.

When hole measurement was performed, the carrier concentration of GaN was $1 \times 10^{17}$ $cm^3$, and its hole mobility was 350 $cm^2/V \cdot sec$, i.e., the crystallinity of GaN was very good. When GaN was grown on an AlN buffer layer by a conventional apparatus, the carrier concentration of GaN was $5 \times 10^{17}/cm^3$, and its Hall mobility was 250 $cm^2/V \cdot sec$. Note that as described in Appl. Phys. lett, 48, 1986, page 353, the crystallinity of GaN is significantly improved by forming an AlN buffer layer before GaN is vapor-grown.

Even after the reaction was caused twice or more by this apparatus, no Ga fell from the reaction gas blow tube on the substrate 1, and therefore no Ga adhered on the substrate 1. In addition, the sub blow tube in the upper portion was not contaminated.

EXAMPLE 3

InGaN was vapor-grown on the surface of a sapphire substrate by the following steps.

① A sapphire substrate (C face) washed well and having a diameter of 2 inches was placed on the susceptor 4.

② Air in the chamber 6 was sufficiently exhausted and replaced by $H_2$.

③ While $H_2$ gas was flowed into the chamber 6 from the reaction gas blow tube 2 having an inner diameter of about 10 mm and the sub blow tube 3 having a maximum diameter of about 60 mm, the temperature of the substrate 1 was increased to 1,150° C. and maintained for 10 minutes.

④ Thereafter, the temperature of the substrate 1 was slowly decreased to 550° C.

⑤ Hydrogen and nitrogen gases were blown from the sub blow tube 3 in the upper portion, and ammonia gas, hydrogen gas, TMG gas, and trimethylindium (TMI) gas were blown from the reaction gas blow tube 2.

The flow rate of both of hydrogen and nitrogen gases blown from the sub blow tube 3 was 5 l/min.

The flow rates of the ammonia gas, the hydrogen gas, the TMG gas, and the trimethyl indium (TMI) gas were 5 l/min, 1 l/min, $2.2 \times 10^{-6}$ mol/min, and $1.5 \times 10^{-7}$ mol/min, respectively.

This state was maintained for 120 minutes to vapor-grow a mixed crystal film of $In_{0.06}Ga_{0.94}N$ on the surface of the sapphire substrate 1.

After the vapor-growth, the substrate 1 was removed from the chamber 6, and its film thickness was observed. As a result, InGaN having a film thickness of 2 $\mu m \pm 10\%$ was grown on the entire surface of the 2-inch diameter substrate.

When Hall measurement was performed for this sample, the measurement was impossible because the resistivity was over $10^8 \Omega \cdot cm$.

Since the Hall measurement was almost impossible because the resistivity of the InGaN crystal was very high, the photoluminescence of InGaN was measured to evaluate its crystallinity. Since luminescence of 440 nm was difficult to confirm in the InGaN crystal at room temperature, the luminescence was measured by decreasing the temperature to that of liquid nitrogen or liquid helium. Generally, the better the crystallinity, the higher the temperature at which luminescence can be measured. According to the present invention, however, luminescence of 440 nm was observed at room temperature. This indicates that the crystallinity of the semiconductor crystal film obtained by the method of the present invention is very good.

EXAMPLE 4

A device capable of using the semiconductor crystal layer according to the present invention is mainly a light-emitting device, and particularly, a blue light-emitting diode and a blue laser diode. Examples of the diode will be described below.

Crystal growth was performed following the same procedures as in Example 1 except that in the seventh step in Example 1, after a GaN layer was grown for 60 minutes, diethylzinc (DEZ) was flowed in addition to the TMG gas at $5.0 \times 10^{-5}$ mol/min to vapor-grow a Zn-doped GaN layer for six minutes.

As a result, a wafer having a structure in which a 4-$\mu$m thick undoped GaN layer was formed on a sapphire substrate and a 0.4-$\mu$m thick Zn-doped GaN layer was laminated thereon was manufactured.

This wafer was cut into a 0.5-mm $\times$ 0.5-mm square piece by a dicing saw, and Al and In electrodes were extracted from the Zn-doped GaN layer and the undoped GaN layer, respectively. The resultant square sample was placed on a lead frame and subjected to wire bonding, and resin molding was performed to manufacture a light-emitting diode.

When the light-emitting diode having the above structure was caused to emit light by a current of 10 mA, the emission wavelength of the diode was 480 nm, and its luminance was 20 mcd.

Growth of GaN by Conventional Method

To compare the semiconductor crystal film obtained by the method of the present invention with a conventional product, GaN was grown on the surface of a sapphire substrate by the following steps.

Figure 1:
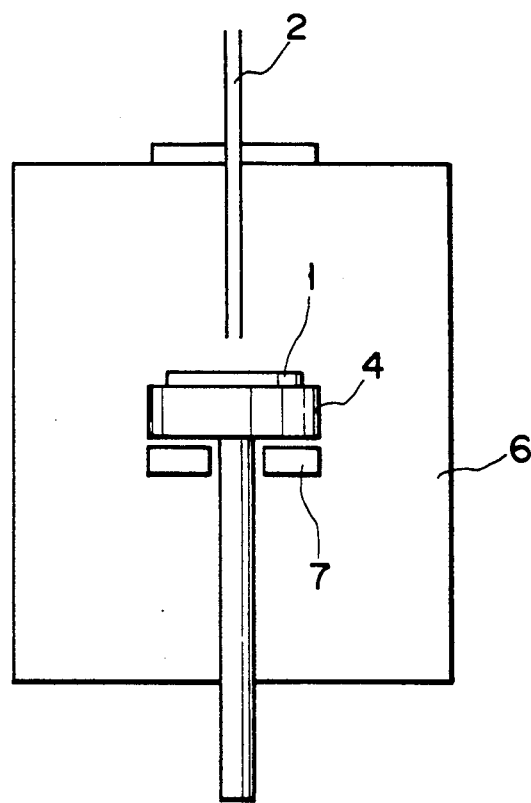
FIGS. 1 to 5 are schematic sectional views each showing a conventional semiconductor crystal film growth apparatus.
Figure 2:
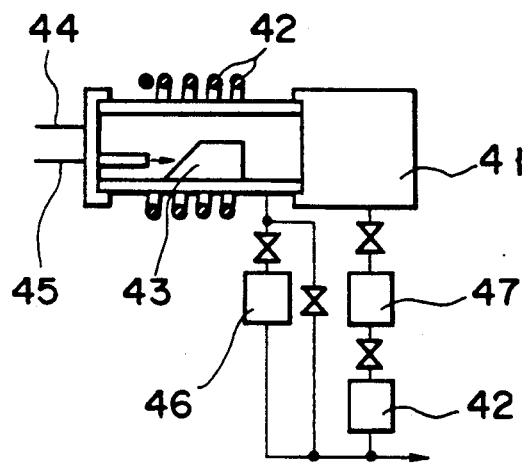
Figure 3:
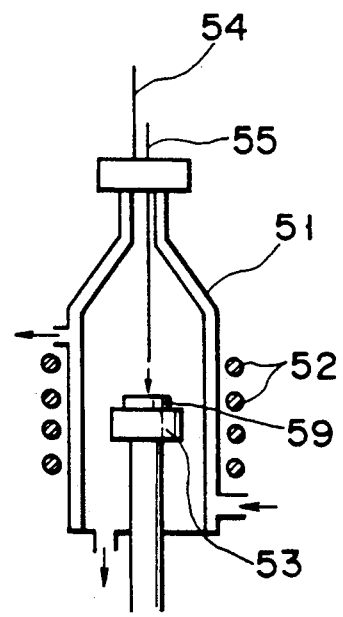
Figure 4:
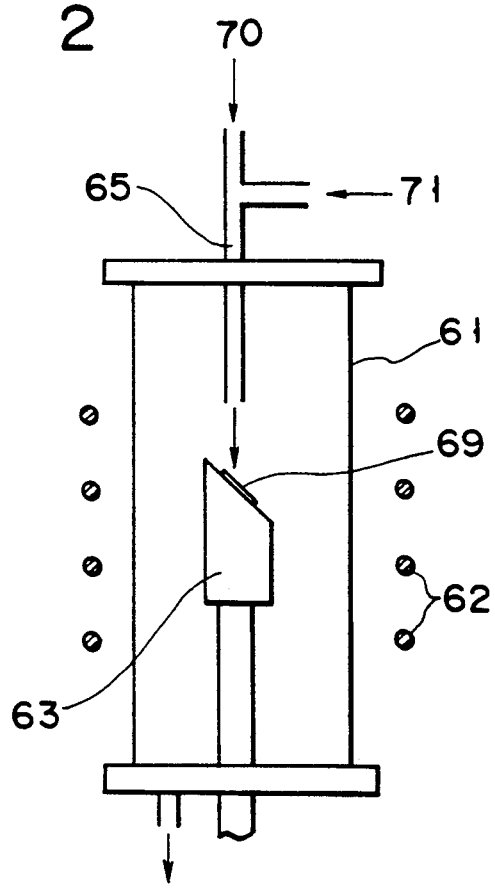
Figure 5:
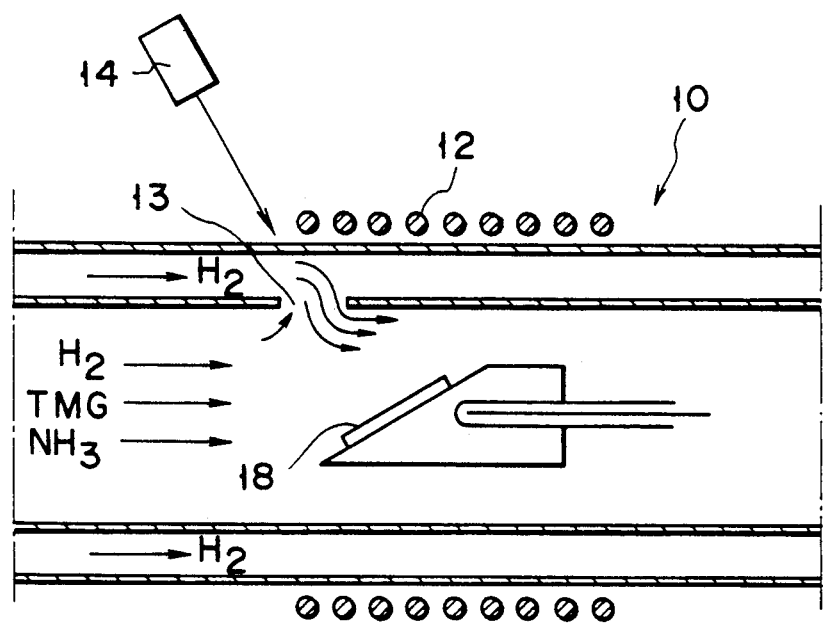

The structure shown in FIG. 1 was used as a vapor-growth apparatus. In the apparatus shown in FIG. 1, the thin reaction gas blow tube 2 having an inner diameter of 8 mm was vertically fixed above the sapphire substrate 1 so as to be separated by 10 mm from the substrate 1.

① The 2-inch diameter sapphire substrate 1 (C plane) washed well and clean was placed on the susceptor 4.

② The stainless steel chamber 6 was exhausted by the exhaust pump and replaced by $H_2$.

③ Thereafter, while $H_2$ gas was supplied from the reaction gas blow tube 2 into the chamber 6, the susceptor 4 was heated up to 1,150° C.

④ Thereafter, this state was maintained for 10 minutes to remove an oxide film on the sapphire surface.

⑤ The reaction temperature of the substrate 1 was decreased to 1,000° C., and the substrate was left to stand until the temperature was stabilized.

⑥ Subsequently, ammonia gas and hydrogen gas were supplied from the reaction gas blow tube 2.

The flow rates of the ammonia gas and the hydrogen gas blown from the reaction gas blow tube were adjusted to be 5 l/min and 1 l/min, respectively, and this state was maintained until the temperature was stabilized.

⑦ Thereafter, in addition to the ammonia gas and the hydrogen gas, TMG gas was blown from the reaction gas blow tube 2. The flow rate of the TMG gas was $2.7 \times 10^{-5}$ mol/min. In this state, vapor-growth was started and continued for 30 minutes. In this vapor-growth step, the susceptor 4 was rotated at 5 rpm. After the vapor-growth, the substrate 1 was removed from the chamber 6 to measure its film thickness. As a result, GaN having a diameter of about 8 mm was grown to have a thickness of 7 μm on the central portion of the 2-inch diameter sapphire substrate 1, and almost no GaN growth was seen outside the region.

In this method, a quartz window formed in the upper portion of the chamber 6 was totally blackened to make it impossible to observe the inside after the reaction was performed only once.

When the reaction was successively performed twice by this apparatus, a large amount of Ga adhered on a growth region having a diameter of 8 mm at the center of the sapphire substrate 1, and no GaN growth was seen on this portion where Ga adhered, resulting in very low yield.

EXAMPLE 5

The structure shown in FIG. 7 was used as a vapor growth apparatus.

① A washed and clean sapphire substrate was placed on the susceptor 4, and the susceptor 4 was loaded into the chamber 6.

② After the reactor 6 was evacuated by a vacuum pump (not shown) through the exhaust port 8, $H_2$ gas was flowed from the reaction gas blow tube 2 to replace the interior of the reactor.

③ Thereafter, while the $H_2$ gas was flowed, the susceptor 4 was heated up to 1,050° C.

④ This state was maintained for 10 minutes to remove an oxide film on the sapphire surface.

⑤ The temperature of the susceptor 4 was decreased to 993° C. while hydrogen gas was flowed, and the substrate was left to stand until the temperature was stabilized.

⑥ Ammonia gas as a nitrogen source and hydrogen gas as a carrier gas were supplied from the reaction gas blow tube 2 at flow rates of 5.0 l/min and 1.0 l/min, respectively, and hydrogen gas was flowed from the transparent tube 15 at a flow rate of 10.0 l/min. This state was maintained until the temperature was stabilized.

⑦ Subsequently, in addition to the ammonia and hydrogen gases, TMG gas was flowed as a Ga source from the reaction gas blow tube at a flow rate of $2.7 \times 10^{-5}$ mol/min for 60 minutes to grow a GaN epitaxial layer. During the growth, the susceptor 4 was slowly rotated.

Infrared radiation radiated from the epitaxial layer in the step ⑦ were detected by a narrow optical bandpass narrow pyrometer 14 for measuring an infrared intensity of 0.96 μm. FIG. 10 shows the infrared intensity detected by the pyrometer 14, i.e., the temperature. As shown in FIG. 10, since the infrared intensity oscillates by interference effects as the epitaxial layer was grown, the film thickness of the epitaxial layer can be calculated by measuring the period of the oscillation. Alternatively, laser light having a particular wavelength may be radiated to measure the film thickness on the basis of a change in intensity of the reflected laser light.

Even after the growth of GaN was successively performed 100 times by this method, the transparent tube 15 was not contaminated. Therefore, the growth state of the semiconductor crystal layer could be observed through the transparent tube 15 and accurately checked by using the pyrometer.

EXAMPLE 6

The apparatus shown in FIG. 8 was used to grow a GaAs crystal layer by radiating ultraviolet rays from the light source 89.

GaAs crystals were used as the substrate 1 to be placed on the susceptor 4. Arsine ($AsH_3$) gas as an As source, TMG gas as a Ga source, and hydrogen gas as a carrier gas were flowed from the reaction gas blow tube 2.

A 500-W mercury lamp was used as the light source 9. Ultraviolet rays radiated from the mercury lamp were focused by a lens and radiated on the substrate 1.

In this state, the substrate temperature was increased to about 400° C. to 500° C. by the heater 7 to grow GaAs in accordance with a light radiation MOCVD method. Hydrogen gas was constantly flowed through the transparent tube 15 at a flow rate of 10.0 l/min from the beginning to the end of the reaction.

In this state, a GaAs epitaxial layer could be grown for 60 minutes. During the growth, ultraviolet rays could be uniformly radiated since the transparent tube 15 was not contaminated.

Even after the growth of the GaAs crystal layer was successively performed 100 times by the apparatus shown in FIG. 8 in accordance with the light radiation MOCVD method, the transparent tube 15 was not contaminated. Therefore, ultraviolet rays could be efficiently radiated on a GaAs substrate through the transparent tube 15.

Each of the semiconductor layer crystal growth apparatuses used in Examples 5 and 6 comprises a transparent tube as a "monitor window" in the reactor. This transparent tube is a cylinder having a proximal end tapered narrower than its distal end. At least a portion of the transparent tube projects outside the reactor, and its distal end is open in the reactor. A gas is supplied from the proximal end of the transparent tube. In the apparatus having this structure, a gas does not form a turbulent flow but forms a laminar flow inside the transparent tube because the distal end of the transparent tube is open in the reactor. Therefore, no reaction gas flows into the transparent tube to contaminate it.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is;

1. A method of vapor-growing a gallium nitride group semiconductor crystal layer using a metal organic chemical vapor deposition method, comprising the steps of:

heating the substrate;

supplying a reaction gas to a surface of the heated substrate so as to be parallel or obliquely to said substrate;

blowing a pressing gas by using a blow tube widened toward a blow port, substantially in a vertical direction toward said substrate to bring said reaction gas into contact with the surface of said substrate;

each of said step being performed under atmospheric pressure.

2. A method according to claim 1, wherein a gas velocity of said pressing gas on the substrate is 0.02 to 0.5 m/s.

3. A method according to claim 1, wherein the gallium nitride group compound is represented by the general formula $Ga_{1-x-y}Al_xIn_yN$, wherein $0 \leq x \leq 1$, $0 \leq y \leq 1$.

4. A method according to claim 1, wherein said blow tube has a funnel-like portion and is widened toward said blow port by an angle of not more than 20° with respect to an axis of said blow tube.

5. A method according to claim 1, wherein said blow tube has a funnel-like portion and is funnel-shaped and is widened by an angle of not more than 10° with respect to an axis of said blow tube.

6. A method according to claim 1 wherein said reaction gas is selected from the group consisting of trimethylgallium (TMG), trimethylaluminum (TMA), diethylzinc (DEZ), trimethylindium (TMI) and ammonia ($NH_3$).

7. A method according to claim 1, wherein said pressing gas is selected from the group consisting of $H_2$, $N_2$, $NH_3$, He, Ne, and Ar.

8. A method according to claim 1, wherein the substrate is heated to a temperature of 1000° C. or more.

9. A method of vapor-growing a gallium nitride group compound semiconductor crystal layer using metal organic chemical vapor deposition method, comprising the steps of:

heating the substrate;

supplying a reaction gas to a surface of the heated substrate so as to be parallel or obliquely to said substrate;

blowing a pressing gas substantially in a vertical direction toward said substrate to bring said reaction gas into contact with the surface of said substrate;

each of said step being performed under atmospheric pressure.

10. A method according to claim 9, wherein said gas is blown by a blow tube having an opening.

11. A method according to claim 9, wherein said semiconductor is a gallium nitride group compound.

12. A method according to claim 9, wherein a gas velocity of the pressing gas on said substrate is 0.02 to 0.5 m/s.

13. A method according to claim 10, wherein the gallium nitride group compound is represented by the general $Ga_{1-x-y}Al_xIn_yN$, wherein $0 \leq x \leq 1$, $0 \leq y \leq 1$.

14. A method according to claim 9, wherein said reaction gas is selected from the group consisting of trimethylgallium (TMG), trimethylaluminum (TMA), diethylzinc (DEZ), trimethylindium (TMI), and ammonia ($NH_3$).

15. A method according to claim 14, wherein said blow tube is transparent, and vapor-growth of a semiconductor crystal film is observed through said blow tube.

16. A method according to claim 15, further comprising the step of radiating light on said substrate through said blow tube.

17. A method according to claim 9, wherein said pressing gas is selected from the group consisting of $H_2$, $N_2$, $NH_3$, He, Ne, and Ar.

* * * * *